(12) United States Patent
Shimizu et al.

(10) Patent No.: US 11,387,504 B2
(45) Date of Patent: *Jul. 12, 2022

(54) HEAT DISSIPATING STRUCTURE AND BATTERY PROVIDED WITH THE SAME

(71) Applicant: SHIN-ETSU POLYMER CO., LTD., Tokyo (JP)

(72) Inventors: Takao Shimizu, Saitama (JP); Nils Andersson, Kirchheim unter Teck (DE); Markus Christ, Kirchheim unter Teck (DE); Christian Brommer, Kirchheim unter Teck (DE); Hubert Schnuepke, Kirchheim unter Teck (DE); Marc Fuchslocher, Kirchheim unter Teck (DE)

(73) Assignee: SHIN-ETSU POLYMER CO., LTD., Tokyo (JP)

( * ) Notice: Subject to any disclaimer, the term of this patent is extended or adjusted under 35 U.S.C. 154(b) by 184 days.

This patent is subject to a terminal disclaimer.

(21) Appl. No.: 16/783,169

(22) Filed: Feb. 6, 2020

(65) Prior Publication Data
US 2020/0259223 A1 Aug. 13, 2020

(30) Foreign Application Priority Data
Feb. 7, 2019 (JP) .............................. JP2019-020327

(51) Int. Cl.
*H01M 10/613* (2014.01)
*H01M 10/653* (2014.01)
*H01M 10/6551* (2014.01)
*H01M 10/6556* (2014.01)
*H05K 7/20* (2006.01)

(52) U.S. Cl.
CPC ....... *H01M 10/613* (2015.04); *H01M 10/653* (2015.04); *H01M 10/6551* (2015.04); *H01M 10/6556* (2015.04); *H05K 7/20263* (2013.01)

(58) Field of Classification Search
CPC ............. H01M 10/613; H01M 10/653; H01M 10/6551; H01M 10/6556; H01M 10/647; H01M 50/20; H01M 10/617; H01M 10/625; H01M 10/6554; H01M 10/6568; H01M 10/655; H05K 7/20263; F28D 1/02; F28D 2021/0029; F28F 2013/006; F28F 21/02; Y02E 60/10; Y02P 70/50

See application file for complete search history.

(56) References Cited

U.S. PATENT DOCUMENTS

| | | | | |
|---|---|---|---|---|
| 2011/0151305 A1* | 6/2011 | Bolze | .................. | H01M 10/625 429/120 |
| 2011/0189525 A1* | 8/2011 | Palanchon | .......... | H01M 10/613 429/120 |
| 2012/0301772 A1* | 11/2012 | Hirsch | .............. | H01M 10/6554 429/120 |
| 2013/0189558 A1* | 7/2013 | Haussmann | ........ | H01M 10/613 429/120 |
| 2017/0338532 A1* | 11/2017 | Mott | .................. | H01M 10/659 |
| 2019/0221905 A1 | 7/2019 | Shimizu | | |

FOREIGN PATENT DOCUMENTS

| | | |
|---|---|---|
| EP | 3512033 A1 | 7/2019 |
| JP | H9321468 A | 12/1997 |
| JP | 2008-243999 A | 10/2008 |
| JP | 2015207541 A | 11/2015 |

* cited by examiner

*Primary Examiner* — Muhammad S Siddiquee
(74) *Attorney, Agent, or Firm* — Hauptman Ham, LLP

(57) ABSTRACT

A heat dissipating structure for a battery includes a plurality of heat dissipating members connected for enhancing heat dissipation from a heat source and a fixation member. The heat dissipating member includes a spirally winding shaped heat conduction sheet for conducting heat from the heat source, a cushion member that is provided on an annular back surface of the heat conduction sheet, and deformable following a surface shape of the heat source more easily than the heat conduction sheet, and a through passage penetrating in a winding direction of the heat conduction sheet. The fixation member fixes the heat dissipating members orthogonally arranged to a longitudinal direction thereof. The fixation member fixes at least each one end of the heat dissipating members in the longitudinal direction.

17 Claims, 7 Drawing Sheets

HEAT DISSIPATING STRUCTURE AND BATTERY PROVIDED WITH THE SAME

CROSS REFERENCE

The present application claims the benefit of priorities of Japanese Patent Application No. 2019-020327 filed on Feb. 7, 2019 the entire contents of which are incorporated herein by reference. The entire contents of patents, patent applications, and literatures cited in the present application are also incorporated herein by reference.

TECHNICAL FIELD

The present invention relates to a heat dissipating structure and a battery provided with the same.

RELATED ART

A control system of automobiles, aircrafts, ships or electronic devices for home use or business use has become further complicated and highly accurate, and correspondingly the integration of small electronic components on a circuit board has been increasingly densified. As a result, it is strongly requested to solve malfunction or shortening of service life of the electronic components owing to heat generated in the periphery of the circuit board.

Conventionally, rapid heat dissipation from the circuit board has been implemented by using the material excellent in heat dissipation, mounting the heat sink, and driving a cooling fan either in an individual or complex manner. Above all, the method of forming the circuit board itself using the material excellent in heat dissipation, for example, diamond, aluminum nitride (AlN), cubic boron nitride (cBN) or the like extremely increases the cost of the circuit board. Additionally, placement of the cooling fan causes problems of malfunction of a fan as the rotator, need of maintenance for preventing the malfunction, and difficulty in securing a mount space. Meanwhile, a heat dissipating fin is a simple member capable of increasing a surface area by forming many columnar or flat plate-like projections made of high heat conduction metal (for example, aluminum) to further enhance heat dissipation. The heat dissipating fin has been generally used as the heat dissipating component (see Japanese Patent Laid-Open No. 2008-243999).

Recently, for the purpose of reducing a load to global environment, conversion of a conventional gasoline-powered vehicle or a diesel vehicle into an electric automobile has become a global upward trend. Particularly, in China as well as European countries such as France, Netherlands, and Germany, electric automobiles have been widely adopted. To encourage widespread adoption of electric automobiles, constructing charging stands is required in addition to development of high-performance batteries. Particularly, technological development for enhancing a charging-discharging function of a lithium automobile battery is an important issue. It is well known that automobile batteries cannot sufficiently exert charging-discharging functions under a high temperature of 60° C. or higher. Therefore, as with the aforementioned circuit board, heat dissipating enhancement is regarded as an important issue for the battery.

In order to implement the rapid heat dissipation from the battery, the structure to be described below has been employed. The structure is formed by disposing a water-cooling pipe in a housing formed of metal excellent in heat conductivity such as aluminum. Many battery cells are disposed in the housing, and a rubber sheet with adhesiveness is interposed between the battery cells and a bottom surface of the housing. The above-structured battery allows the battery cells to conduct heat to the housing via the rubber sheet, and to effectively remove heat through water cooling.

The heat conductivity of the rubber sheet used for the generally employed battery is lower than that of aluminum or graphite. Therefore it is difficult to effectively transfer heat from the battery cells to the housing. The use of a spacer of graphite or the like to be interposed in place of the rubber sheet may be considered.

However, as the battery cells are not flat because of stepped lower surfaces, gaps are formed between the battery cells and the spacer, resulting in deteriorated heat conduction efficiency. As described in the example, the battery cells can take various forms (including uneven or non-smooth surface state such as the stepped portion), and therefore the demand for adaptability to the various forms of the battery cells, and achievement of high heat conduction efficiency has been increasing. Preferably, in order to achieve high heat conduction efficiency, the heat dissipation from each battery cell is made uniform to allow each of the battery cells to have uniform temperature. Furthermore, the use of an elastically deformable material lighter in weight for the container of the battery cell has been demanded. A heat dissipating structure has been demanded to allow weight dissipation of the battery cell, and restoration of the shape nearly to the original state after removing the battery cells. This applies not only to the battery cell but also to other heat sources such as the circuit board, the electronic component, and the electronic device body.

The present invention provides a heat dissipating structure adaptable to various forms of heat source, light in weight, elastically deformable, excellent in heat dissipating efficiency, and capable of enhancing uniformity in heat dissipation from the respective heat sources, and a battery provided with the heat dissipating structure.

SUMMARY (1) A heat dissipating structure has a plurality of heat dissipating members connected for enhancing heat dissipation from a heat source and a fixation member. Each of the heat dissipating members includes a heat conduction sheet in a spirally winding shape for conducting heat from the heat source, a cushion member that is provided on an annular back surface of the heat conduction sheet, and is deformable following a surface shape of the heat source more easily than the heat conduction sheet, and a through passage penetrating in a winding direction of the heat conduction sheet. The fixation member fixes the heat dissipating members orthogonally arranged to a longitudinal direction of the heat dissipating member. The fixation member fixes at least one end of each of the heat dissipating members in the longitudinal direction.

(2) In the heat dissipating structure, preferably, the fixation member fixes both ends of each of the heat dissipating members in the longitudinal direction.

(3) In the heat dissipating structure, preferably, the fixation member is formed to surround the heat dissipating members orthogonally arranged to the longitudinal direction of the heat dissipating member.

(4) In the heat dissipating structure, preferably, the fixation member is formed to have a thickness smaller than a thickness of the heat dissipating member deformed under pressure force applied from the heat source.

(5) In the heat dissipating structure, preferably, the cushion member is cylindrically shaped, and includes the through passage extending in the longitudinal direction. The heat conduction sheet is spirally wound around an outer surface of the cylindrically shaped cushion member.

(6) In the heat dissipating structure, preferably, the cushion member is spirally shaped, and spirally winding along the annular back surface of the heat conduction sheet.

(7) Preferably, the heat dissipating structure includes a connection member for connecting the heat dissipating members orthogonally arranged to the longitudinal direction. The connection member is formed of a thread.

(8) In the heat dissipating structure, preferably, the connection member includes a twisted portion interposed between the heat dissipating members.

(9) In the heat dissipating structure, preferably, a heat conduction oil is applied to a surface of the heat conduction sheet for enhancing heat conductivity to the surface from the heat source in contact with the surface.

(10) In the heat dissipating structure, preferably, the heat conduction oil contains a silicone oil and a heat conduction filler that exhibits higher heat conductivity than the silicone oil. The heat conduction filler is formed of at least one of metal, ceramics, and carbon.

(11) A battery includes one or more battery cells each as a heat source in a housing that allows flow of a cooling agent. The heat dissipating structure of any one of (1) to (10) is disposed between the battery cell and the housing.

ADVANTAGEOUS EFFECT OF INVENTION

The present invention provides a heat dissipating structure adaptable to various forms of heat source, light in weight, elastically deformable, excellent in heat dissipating efficiency, and capable of enhancing uniformity in heat dissipation from the respective heat sources, and a battery provided with the heat dissipating structure.

DETAILED DESCRIPTION

Figure 1A:
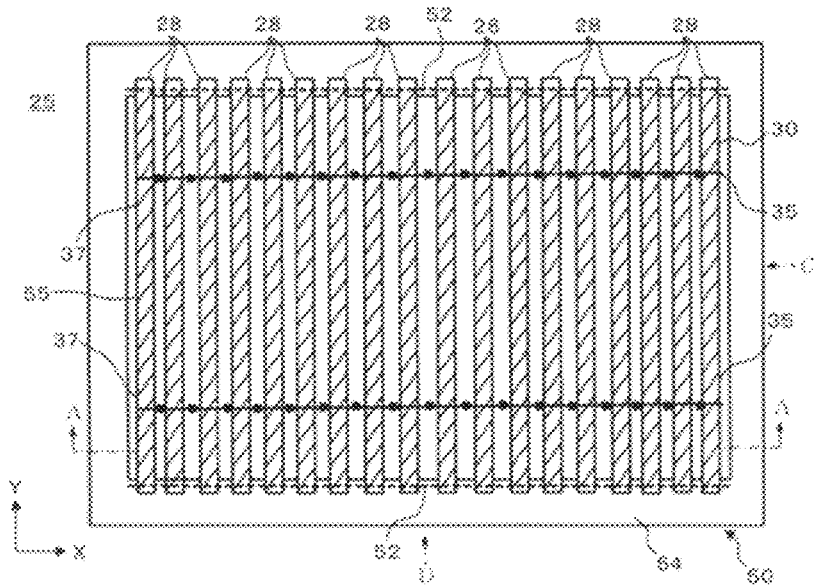
FIG. 1A is a plan view of a heat dissipating structure according to a first embodiment.

Embodiments of the present invention are described referring to the drawings. Each embodiment described herein does not limit the invention according to the scope of the claims, and all elements described in each embodiment, and all combinations thereof are not necessarily essential for implementing the present invention.

First Embodiment

Figure 1B:
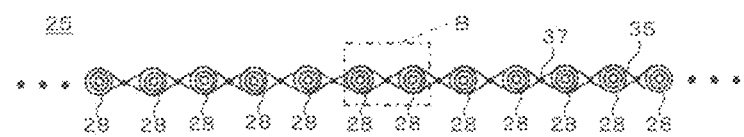
FIG. 1B is a sectional view taken along line A-A of FIG. 1A.
Figure 1C:
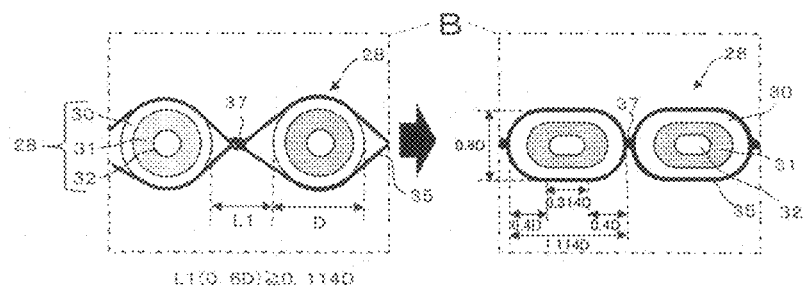
FIG. 1C is an enlarged view of a region B of FIG. 1B.
Figure 2A:
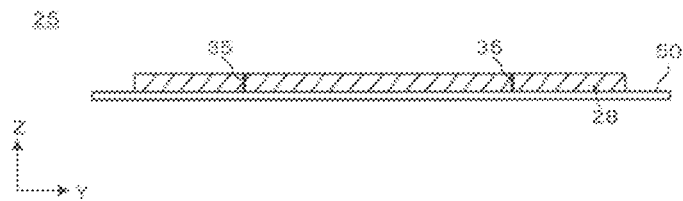
FIG. 2A is a side view of the heat dissipating structure shown in FIG. 1A viewed from an arrow C direction.
Figure 2B:
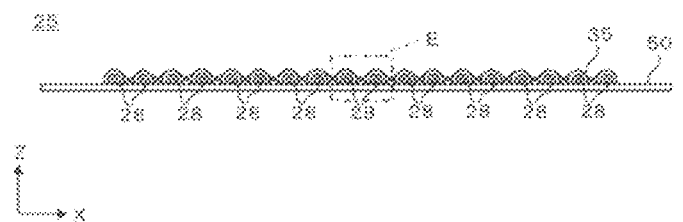
FIG. 2B is a side view of the heat dissipating structure shown in FIG. 1A viewed from an arrow D direction.
Figure 2C:
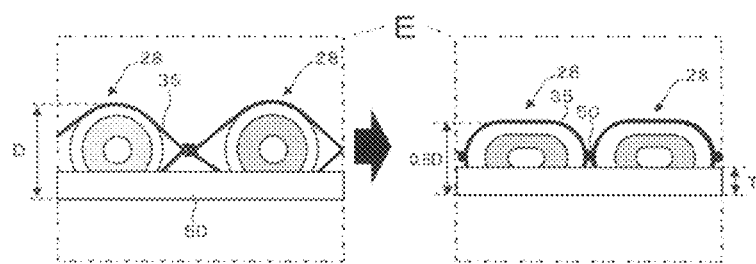
FIG. 2C is an enlarged view of a region E of FIG. 2B.
Figure 3A:
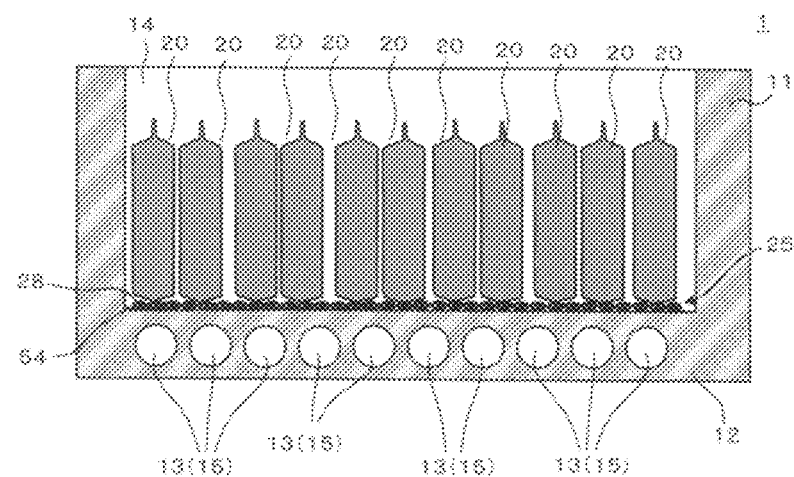
FIG. 3A is a longitudinal sectional view of the heat dissipating structure according to the first embodiment, and a battery provided with the heat dissipating structure.
Figure 3B:
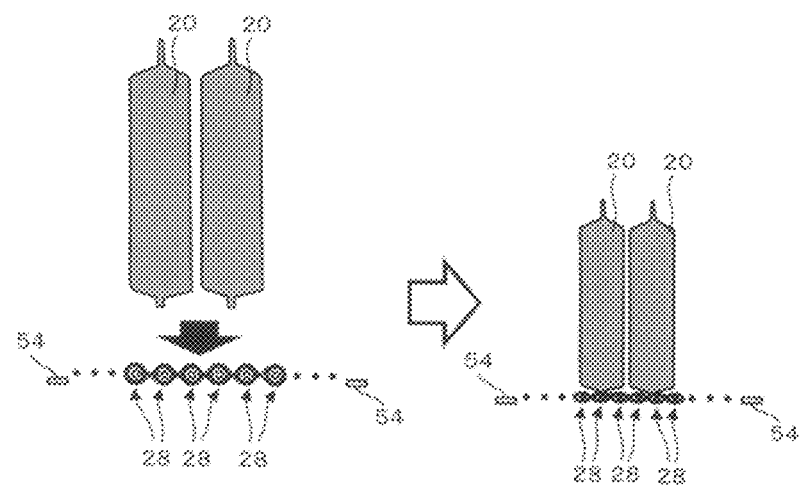
FIG. 3B is a sectional view illustrating change in formation of the heat dissipating structure before and after it is compressed by battery cells as shown in FIG. 3A.

FIG. 1A is a plan view of a heat dissipating structure according to a first embodiment. FIG. 1B is a longitudinal sectional view taken along line A-A of FIG. 1A. FIG. 1C is an enlarged view of a region B as shown in FIG. 1B. FIG. 2A is a side view of the heat dissipating structure of FIG. 1A viewed from an arrow C direction. FIG. 2B is a side view of the heat dissipating structure of FIG. 1A viewed from an arrow D direction. FIG. 2C is an enlarged view of a region E of FIG. 2B. FIG. 3A is a longitudinal sectional view of the heat dissipating structure according to the first embodiment, and a battery provided with the heat dissipating structure. FIG. 3B is a sectional view illustrating change in the formation of the heat dissipating structure before and after it is compressed by battery cells as shown in FIG. 3A.

As illustrated in FIG. 3A and FIG. 3B, a battery 1 is structured to have a plurality of battery cells 20 in a housing 11 in contact with cooling agent 15. Preferably, a heat dissipating structure 25 is provided between the battery cells 20 as heat sources at proximal ends (lower ends) closer to the cooling agent 15, and a part (bottom 12) of the housing 11 at a side closer to the cooling agent 15. The word, "heat dissipating structure" may be called as "thermal conductor", "thermal conductive body" or "thermal conductive structure". As illustrated, the heat dissipating structure 25 accommodates 11 battery cells 20. However, the number of the battery cells 20 to be placed on the heat dissipating structure 25 is not limited to 11. The number of heat dissipating members 28 constituting the heat dissipating structure 25 disposed in the battery 1 is not specifically limited.

The heat dissipating structure 25 is formed with the heat dissipating members 28 connected for enhancing heat dissipation from the battery cells 20. The heat dissipating member 28 includes a spirally winding heat conduction sheet 30 for conducting heat from the battery cell 20, a cushion member 31 that is provided on an annular back surface of the heat conduction sheet 30, and more deformable following the surface shape of the battery cell 20 than the heat conduction sheet 30, and a through passage 32 penetrating in the spirally winding direction of the heat conduction sheet 30. The heat dissipating structure 25 includes a fixation member 50 capable of fixing the heat dissipating members 28 (in X direction of FIG. 1A) orthogonally arranged to the longitudinal direction, specifically, at least one longitudinal ends of the heat dissipating members 28 (in Y direction of FIG. 1A). Preferably, the fixation member 50 fixes both longitudinal ends of the heat dissipating members 28. The heat conduction sheet 30 is preferably formed of a material with superior heat conductivity to that of the cushion member 31. The cushion member 31 is preferably formed in a cylindrical shape, having a through passage 32 in the longitudinal direction. The heat conduction sheet 30 is spirally wound around an outer surface of the cylindrical cushion member. Preferably, the heat dissipating structure 25 has a connection member 35 for connecting the heat dissipating members 28 (in X direction of FIG. 1A) orthogonally arranged to the longitudinal direction. Preferably, in the heat dissipating structure 25, heat conduction oil is applied to the surface and/or inside of the heat conduction sheet 30 for enhancing heat conductivity to the surface from the battery cells 20 in contact therewith. Each of the heat dissipating members 28 constituting the heat dissipating structure 25 has a substantially cylindrical shape when the battery cells 20 are not mounted. Once the battery cells 20 are mounted, the heat dissipating members 28 will be compressed and flattened under the heavy load.

The heat conduction sheet 30 has a belt-like shape while spirally winding in the longitudinal direction of the substantially cylindrical shape around the outer surface of the heat dissipating member 28. The heat conduction sheet 30 contains at least one of metal, carbon, and ceramics, and has a function of conducting heat from the battery cells 20 to the cooling agent 15. The term "cross section" or "longitudinal cross section" to be used herein refers to a cross section in a vertically cutting direction from an upper opening surface of an inside 14 of the housing 11 of the battery 1 to the bottom 12.

Schematic structures of the battery 1 and components of the heat dissipating structure 25 are described in more detail.

(1) Summary of Battery Structure

In this embodiment, the battery 1 is, for example, employed for an electric automobile, and includes many battery cells 20 (simply referred to as cells). The battery 1 includes a bottomed housing 11 having an opening on one side. The housing 11 is preferably formed of aluminum or aluminum base alloy. The cells 20 are disposed in the inside 14 of the housing 11. Electrodes (not illustrated) project from the upper sides of the cells 20, respectively. The cells 20 preferably in the housing 11 are in tight contact with each other (not illustrated) by application of force in the compressing direction from both sides by utilizing screws or the like. The bottom 12 of the housing 11 is provided with one or more water-cooling pipes 13 to allow flow of cooling water as the cooling agent 15. The cooling agent may be referred to as a cooling medium or a cooling member. The cells 20 are disposed inside the housing 11 to interpose the heat dissipating structure 25 with the bottom 12. In the above-structured battery 1, heat of the cells 20 is conducted to the housing 11 through the heat dissipating structure 25 and effectively removed by water cooling. The cooling agent 15 is not limited to the cooling water, but may be interpreted to include an organic solvent such as liquid nitrogen and ethanol. The cooling agent 15 is not limited to liquid when used for cooling, but may be in gaseous or solid form.

(2) Heat Conduction Sheet

The heat conduction sheet 30 preferably contains carbon, and more preferably contains carbon filler and resin. The resin may be replaced with a synthetic fiber. In this case, preferably, aramid fiber is usable. The "carbon" described herein may be widely interpreted to contain an arbitrary structure composed of carbon (C) such as graphite, carbon black with lower crystallinity than graphite, expanded graphite, diamond, diamond-like carbon having a similar structure to diamond. In this embodiment, the heat conduction sheet 30 may be a thin sheet obtained by curing a material having graphite fiber or carbon particles compounded and dispersed in resin. The heat conduction sheet 30 may be the carbon fiber formed through meshed weaving, mixed spinning, or mixed knitting. Various types of fillers such as graphite fiber, carbon particles, and carbon fiber may be considered to fall under the concept of the carbon filler.

The resin contained in the heat conduction sheet 30 may or may not exceed 50 mass % to the total mass of the heat conduction sheet 30. That is, the resin may or may not be used as a main material for forming the heat conduction sheet 30 so long as the resultant heat conduction is not seriously affected. The thermoplastic resin may be suitably used as the resin, for example. It is preferable to use the resin with high melting point at which it may be kept unmelted in heat conduction from the cell 20 as the heat source, for example, polyphenylene sulfide (PPS), polyetheretherketone (PEEK), polyamide imide (PAI), and aromatic polyamide (aramid fiber). Before formation of the heat conduction sheet 30, the resin is dispersed in gaps in the carbon filler in the form of particle or fiber. The heat conduction sheet 30 may be formed to have AlN or diamond dispersed as the filler for enhancing heat conduction besides the carbon filler, resin and the like. In place of the resin, elastomer more flexible than the resin may be used. The heat conduction sheet 30 may be formed as the sheet that contains metal and/or ceramics in place of or together with carbon. It is possible to selectively use metal with relatively high heat conductivity such as aluminum, copper, and an alloy containing at least one of those metals. It is possible to selectively use ceramics with relatively high heat conductivity such as AlN, cBN, and hBN.

The heat conduction sheet 30 may or may not be excellent in electrical conductivity. Preferably, the heat conductivity of the heat conduction sheet 30 is equal to or higher than 10 W/mK. In the embodiment, the heat conduction sheet 30 is preferably the belt-shaped plate formed of the material excellent in heat conductivity and electrical conductivity, for example, graphite, aluminum, aluminum alloy, copper, or stainless steel. Preferably, the heat conduction sheet 30 exhibits sufficient curving property (or bending property). Although the thickness of the sheet is not limited to the specific value, it is preferable to use a sheet with a thickness ranging from 0.02 to 3 mm, and more preferably, ranging from 0.03 to 0.5 mm. As the thickness increases, the heat conductivity of the heat conduction sheet 30 is lowered. It is preferable to determine the thickness by considering the balance among properties of the sheet such as strength, flexibility, and heat conductivity.

(3) Cushion Member

The cushion member 31 has essential functions of deformability and restorability. The restorability is determined by elastic deformation capability. The deformability is a necessary property for following the shape of the cell 20. Particularly, the cell 20 in an easily deformable package that houses semisolid product such as lithium ion battery, a content having a liquid property and the like is likely to have its design dimension indeterminable, or its dimensional accuracy hardly improved. Therefore, it is important to secure the restorability to retain the deformability and the follow-up property of the cushion member 31.

In this embodiment, the cushion member 31 is cylindrical, and includes the through passage 32. Although the lower ends of the cells 20 are not flat, the cushion member 31 improves the contact between the heat conduction sheet 30 and the lower ends. The through passage 32 makes the cushion member 31 easily deformable, contributes to weight reduction in the heat dissipating structure 25, and has a function of enhancing the contact between the heat conduction sheet 30 and the lower ends of the cells 20. The cushion member 31 has a function as a protective member that prevents the heat conduction sheet 30 from being damaged due to the load applied thereto, in addition to a function of imparting a cushioning function between the cells 20 and the bottom 12. In this embodiment, the cushion member 31 exhibits the heat conductivity lower than that of the heat conduction sheet 30. In this embodiment, the through passage 32 has a circular cross section. However, the cross section of the through passage 32 is not limited to the circular shape, but may be polygonal, elliptical, semi-circular, and substantially polygonal with rounded vertex, for example. The cross section of the through passage 32 may be constituted by a plurality of through passages, for example, two semicircular cross sections either upper and lower sections, or left and right sections by dividing the circular cross section into two parts.

The cushion member 31 is preferably formed to contain thermosetting elastomer such as silicone rubber, urethane rubber, isoprene rubber, ethylene-propylene rubber, natural rubber, ethylene-propylene-diene rubber, nitrile rubber (NBR), styrene-butadiene rubber (SBR), and the like; urethane-based, ester-based, styrene-based, olefin-based, butadiene-based, or fluorine-based thermoplastic elastomer; or composite thereof. Preferably, the cushion member 31 is formed of a material with high heat resistance that allows retention of formation of the heat conduction sheet 30 without being molten or decomposed by the conducted heat. In this embodiment, more preferably, the cushion member 31 is formed of a material obtained by impregnating silicone into urethane-based elastomer, or silicone rubber. The cushion member 31 may be formed by dispersing the filler represented by, for example, particles of AlN, cBN, hBN, or diamond into rubber to enhance heat conductivity as high as possible. The cushion member 31 may or may not be formed as the material containing bubbles. The "cushion member" represents an elastically deformable member with high flexibility, and capable of being in tight contact with a surface of the heat source, and can be replaced with a term "rubber elastic structure" in the context herein. Furthermore, as a modification of the cushion member 31, metal may be used in place of the rubber elastic structure. For example, the cushion member can be constituted by spring steel. Furthermore, as the cushion member 31, a coil spring can be disposed. Additionally, spirally wound metal may be used as the spring steel, and disposed on the annular back surface of the heat conduction sheet 30 as the cushion member. The cushion member 31 can be constituted by a sponge made of resin and rubber, or a solid material (non-porous structure unlike the sponge).

(4) Connection Member

The connection member 35 is formed of a material, for example, thread and rubber, which is partially deformable at least between the heat dissipating members 28. In this embodiment, the connection member 35 is preferably formed of the thread. More preferably, the thread is resistant to temperature rise owing to heat dissipation from the cell 20. Specifically, the connection member 35 is preferably formed of the thread that is resistant to high temperature of approximately 120° C., and composed of a twisted yarn such fibers as natural fibers, synthetic fibers, carbon fibers, and metal fibers. Preferably, the connection member 35 includes twisted portions 37 each between the heat dissipating members 28 (see FIG. 1C). In the heat dissipating structure 25, although the heat dissipating member 28 is flattened under the pressure force applied by the cell 20, the connection member 35 flexibly deflects while following the deforming heat dissipating member 28. This allows the heat dissipating structure 25 to follow and come into tight contact with the surface of the cell 20. The heat dissipating structure 25 including the twisted portions 37 each interposed between the heat dissipating members 28 further enhances the follow-up property and adhesiveness with the surface of the cell 20. However, the connection member 35 does not necessarily include the twisted portion 37.

(5) Fixation Member

The fixation member 50 is capable of fixing the heat dissipating members 28 which are orthogonally arranged (in direction X of FIG. 1A) to the longitudinal direction of the heat dissipating member 28. The fixation member 50 fixes at least one longitudinal ends of the respective heat dissipating members 28 (in direction Y of FIG. 1A). Preferably, the fixation member 50 surrounds orthogonally arranged heat dissipating members 28 to the longitudinal direction by fixing both longitudinal ends of each of the heat dissipating members 28. In other words, the fixation member 50 includes a frame 54 that surrounds the heat dissipating members 28 both in the longitudinal direction and the direction (width direction) in which the heat dissipating members 28 are arranged. Two opposite sides (two sides in the longitudinal direction of the heat dissipating member 28) of the frame 54 serve to fix the respective heat dissipating members 28. Preferably, both ends of each of the heat dissipating member 28 are placed on the two opposite sides of the frame 54, respectively, and sewn with a thread 52 for fixation. An opening 55 surrounded by the frame 54 is a region in which the heat dissipating members 28 may be compressed by the cells 20 toward the bottom 12. Preferably, the opening 55 has a size sufficiently large to allow insertion of the cells 20. However, the opening 55 may have the size that does not allow insertion of the cells 20. Preferably, the fixation member 50 is formed of resin or rubber, and more preferably, PET film. The material for forming the thread 52 is not specifically limited. Preferably, however, the thread 52 is resistant to the temperature rise owing to heat dissipation from the cell 20. The thread 52 is preferably used for sewing the heat dissipating members 28 on the two opposite sides using a sewing machine or the like. Stitching for sewing with the thread 52 is not specifically limited. An arbitrary stitching may be selectively used from hand stitching, final stitching, zigzag stitching, single chain stitching, double chain stitching, hem stitching, flat stitching, safety stitching, overlock stitching and the like. The stitching may also be selected from those prescribed by JIS L 0120 as codes of "101", "209", "301", "304", "401", "406", "407", "410", "501", "502", "503", "504", "505", "509", "512", "514", "602", and "605".

In the heat dissipating structure 25, the heat dissipating members 28 are fixed to the fixation member 50 while being allowed to be positioned and connected. In order to achieve high heat conduction efficiency, each of the cells 20 is required to dissipate heat uniformly for making each temperature of the cells 20 uniform. Preferably, the plurality of heat dissipating members 28 are arranged so that the number of the heat dissipating members 28 in contact with the cells 20 is made uniform. As the heat dissipating members 28 are positioned with the fixation member 50, the heat dissipating structure 25 ensures that the heat dissipating members 28 contact the cells 20. As a result, the heat dissipating structure 25 may enhance uniformity in heat dissipation from the cells 20, resulting in high thermal conduction efficiency. The material for forming the fixation member 50 is not limited to the resin or the rubber so long as it is not deformed owing to heat dissipation from the cell 20. For example, the fixation member 50 may be formed of such material as metal, plastic, wood, and ceramics. It is possible to fix only one longitudinal end of each of the heat dissipating member 28 to one side of the frame 54.

Upon reception of pressure force from the cell 20, the heat dissipating members 28 are crushed to reduce a distance L1 therebetween. If the heat dissipating members 28 are hardly crushed, there may cause the risk of deteriorating adhesiveness between the heat conduction sheet 30 and the cells 20, and the heat conduction sheet 30 and the bottom 12. The above-described risk may be reduced by setting the thickness of the heat dissipating member 28 in the height direction to be under the vertical pressure force from the bottom of the cell 20 to the surface of the bottom 12 to at least 80% of the cross section diameter of the heat dissipating member 28 (=circular conversion diameter:D). The term "circular conversion diameter" refers to a diameter of a perfect circle with the same area as that of the cross section of the heat dissipating member 28 to be cut perpendicularly to the longitudinal direction. If the heat dissipating member 28 is formed into a cylindrical structure having the cross section formed into the perfect circle, the diameter is equal to the circular conversion diameter. Upon reception of the pressure force, the heat dissipating member 28 can be assumed to deform to have flat surfaces in contact with the cell 20 and the bottom 12, and an arc-like section along the distance L1 between the heat dissipating members 28 (see FIG. 1C). When the heat dissipating member 28 is crushed to have a thickness of 0.8 D corresponding to 80% of the circular conversion diameter D, the resultant extension amount of the heat dissipating member 28 in the direction of the distance L1 is calculated. Referring to FIG. 1C, the total extension length of the arc-like sections of the crushed heat dissipating member 28 at left and right sides is $0.8\pi D$. The length of the flat surface in contact with the bottom 12 is half the length derived from subtracting the total extension length of the arc-like sections from the circumference of cross section of the heat dissipating member 28 as follows: $(\pi D-0.8\pi D)/2=0.314$ D. The length of the arc-like sections extending leftward and rightward along the flat surface is calculated as follows: $0.4$ D$\times 2=0.8$ D. The length of the crushed heat dissipating member 28 extending from the original state in the direction of the distance L1 is calculated as follows: $0.314$ D$+0.8$ D$-$D$=0.114$ D. The sufficiently long distance L1 prevents the contact between the adjacent heat dissipating members 28. Conversely, excessively short distance L1 may bring the adjacent heat dissipating members 28 into contact with each other, and prevent them from being further crushed even under the vertically compressed state. The distance L1 set to 11.4% of the circular conversion diameter D of the heat dissipating member 28 or longer prevents the contact between the adjacent heat dissipating members 28 when they are deformed under pressure force to have the thickness 80% of the circular conversion diameter D. This makes it possible to prevent the contact state from being obstacle to further deformation of the heat dissipating members 28. In this embodiment, the distance L is set to 0.6 D.

Preferably, the fixation member 50 is formed to have a thickness T smaller than the thickness (0.8 D) of the heat dissipating member 28 that has been deformed under pressure force from the cell 20 (see FIG. 2C). The above-formed heat dissipating structure 25 reduces the risk that the contact between the cell 20 and the fixation member 50 prevents further crushing of the heat dissipating member 28 vertically compressed by the cell 20. This makes it possible to prevent the contact state from being obstacle to further deformation of the heat dissipating member 28 compressed and deformed to have a thickness corresponding to 80% of the circular conversion diameter D. As both longitudinal ends of the heat dissipating member 28 are fixed onto the fixation member 50, those ends never come in contact with the bottom 12 of the housing 11. As the other region of the heat dissipating member 28 between both ends comes in contact with the bottom 12, sufficient heat dissipating effect may be obtained. Preferably, the surface of the heat dissipating member 28 closer to the bottom 12 is at the same level as the surface of the fixation member 50 closer to the bottom 12, or slightly protruding toward the bottom 12 so that the fixation member 50 easily comes in contact with the bottom 12.

In the heat dissipating structure 25, the both longitudinal ends (in direction Y of FIG. 1A) of each of the heat dissipating members 28 are sewn and fixed onto the fixation member 50 with the thread 52. The both ends of the heat dissipating member 28 fixed to the fixation member 50 are compressed by the cell 20, and crushed. The heat conduction sheet 30 may come in well contact with the non-flat lower ends of the cells 20 appropriately. In the heat dissipating structure 25, the region of the heat dissipating member 28 other than the both ends fixed to the fixation member 50 is compressed by the cell 20, and crushed. The heat dissipating structure 25 is preferably formed to allow the cells 20 to come in contact with the region of the heat dissipating member 28 other than the both ends fixed to the fixation member 50. Even when the heat dissipating members 28 positioned with the fixation member 50 are compressed and crushed by the cells 20, variation in values of the distance L1 between the heat dissipating members 28 is reduced. This makes it possible to enhance uniformity in heat dissipation from the cells 20. Arrangement of the heat dissipating members 28 is not limited to the one at an equal interval of the distance L1. Preferably, the heat dissipating structure 25 is formed to change the distance L1 between the heat dissipating members 28 so that the heat dissipating members 28 are disposed concentratedly at the position corresponding to the cell 20 at higher temperature among them. Preferably, the heat dissipating structure 25 is formed to reduce the distance L1 between the heat dissipating members 28 to be in contact with the high temperature cells 20 so that more heat dissipating members 28 come in contact with the high temperature cells 20 than those in contact with other cells 20. This allows the battery 1 to further enhance uniformity in heat dissipating property among the cells 20.

(6) Heat Conduction Oil

Preferably, the heat conduction oil contains silicone oil, and a heat conduction filler that exhibits higher heat conductivity than the silicone oil, and is composed of at least one of metal, ceramics, and carbon. The heat conduction sheet 30 includes a gap (hole or recess portion) on a microscopic level. Normally, air existing in the gap may exert adverse influence on the heat conductivity. The heat conduction oil is filled in the gap to remove air to enhance heat conductivity of the heat conduction sheet 30.

The heat conduction oil is applied to the surface of the heat conduction sheet 30, specifically, at least the surface on which the cells 20 come in contact with the heat conduction sheet 30. In the present invention, the "oil" of the heat conduction oil refers to a water-insoluble combustible substance in either liquid or semi-solid form at normal temperature (arbitrary temperature in the range from 20 to 25°

C.). It is possible to use the term "grease" or "wax" in place of the term "oil". The heat conduction oil hardly becomes the obstacle to heat conduction upon heat transfer from the cell 20 to the heat conduction sheet 30. A hydrocarbon based oil and the silicone oil may be used for forming the heat conduction oil. Preferably, the heat conduction oil contains the silicone oil, and the heat conduction filler that exhibits higher heat conductivity than the silicone oil, and is composed of at least one of metal, ceramics, and carbon.

Preferably, the silicone oil is composed of particles having siloxane bond of 2000 or less with linear chain structure. The silicone oil has two types of straight silicone oil and modified silicone oil. The straight silicone oil includes dimethyl silicone oil, methylphenyl silicone oil, and methyl hydrogen silicone oil. The modified silicone oil includes reactive silicon oil and non-reactive silicone oil. The reactive silicone oil includes various types such as amino modified type, epoxy modified type, carboxy modified type, carbinol modified type, methacryl modified type, mercapto modified type, and phenol modified type. The non-reactive silicone oil includes various types such as polyether modified type, methylstyryl modified type, alkyl modified type, higher fatty acid ester modified type, hydrophilic specific modified type, higher fatty acid contained type, and fluorine modified type. Because of properties excellent in heat resistance, cold resistance, viscosity stability, and heat conductivity, the silicone oil is applied to the surface of the heat conduction sheet 30 to serve as the heat conduction oil especially suitable for intervening between the cell 20 and the heat conduction sheet 30.

Preferably, the heat conduction oil contains the heat conduction filler composed of at least one of metal, ceramics, and carbon besides the oil content. Gold, silver, copper, aluminum, beryllium, tungsten and the like are exemplified as metal. Alumina, aluminum nitride, cubic boron nitride, hexagonal boron nitride, and the like are exemplified as ceramics. Diamond, graphite, diamond-like carbon, amorphous carbon, carbon nanotube are exemplified as carbon.

Preferably, the heat conduction oil intervenes between the heat conduction sheet 30 and the housing 11 besides the intervention between the cell 20 and the heat conduction sheet 30. The heat conduction oil may be applied to the surface of the heat conduction sheet 30 entirely or partially. Application of the heat conduction oil to the heat conduction sheet 30 is not necessarily limited to the specific method. The heat conduction oil may be applied arbitrarily by, for example, atomization using the spray, application using the brush or the like, immersion of the heat conduction sheet 30 in the heat conduction oil, and the like. Preferably, the heat conduction oil is used as an element to be suitably added to the heat dissipating structure 25 or the battery 1 rather than as the requisite element therefor. This applies to a second and subsequent embodiments.

Figure 4A:
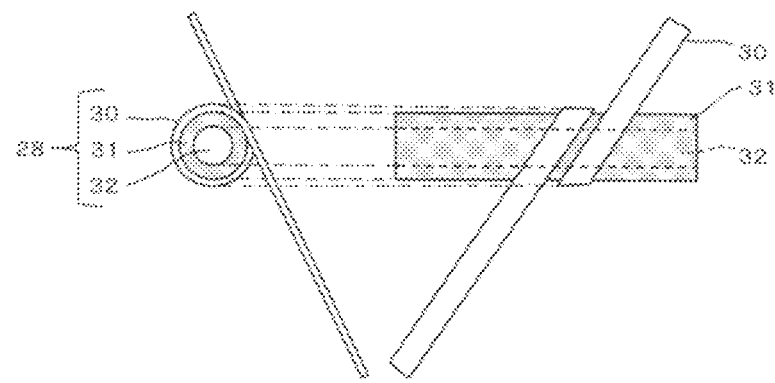
FIG. 4A to FIG. 4C are explanatory views showing a part of a process of forming the heat dissipating structure of FIG. 1A to FIG. 1C.
Figure 4B:
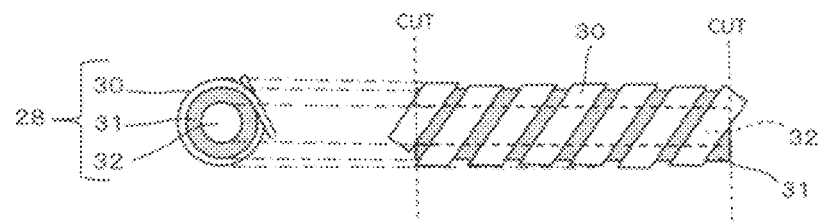
Figure 4C:
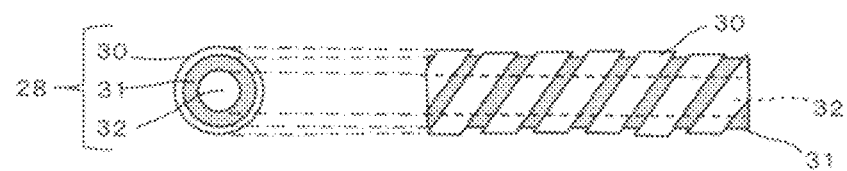

FIG. 4A to 4C are explanatory views of a part of a process of forming the heat dissipating structure of FIG. 1A to FIG. 1C.

First, the cushion member 31 is formed. While the cushion member 31 is in the uncured state before it is completely cured, the belt-like heat conduction sheet 30 is spirally wound around an outer surface of the cushion member 31. The cushion member 31 is then completely cured in heating. Portions of the belt-like heat conduction sheet 30, protruding from both ends of the cushion member 31 are cut. Finally, the heat conduction oil is applied to the surface of the heat conduction sheet 30. In forming the heat dissipating member 28 as described above, the uncured cushion member 31 enters into the gap on the microscopic level generated in the heat conduction sheet 30, and then cured therein. This makes it possible to firmly fix the heat conduction sheet 30 to the cushion member 31 without using the adhesive agent.

The formed heat dissipating member 28 protrudes from the outer surface of the cushion member 31 by the amount corresponding to the thickness of the heat conduction sheet 30. The heat conduction sheet 30 may be flush with the cushion member 31. The heat conduction oil may be applied to the surface of the heat conduction sheet 30, at least on the region in contact with the cell 20. Each timing for executing the process of cutting the heat conduction sheet 30 protruding from both sides of the cushion member 31, and the process of applying the heat conduction oil is arbitrarily set without being limited to the timing as described above. Those processes may be executed at arbitrary timings so long as they are executed after winding the heat conduction sheet 30 around the cushion member 31. The heat conduction sheet 30 may be wound around the outer surface of the cushion member 31 in the completely cured state. If the outer surface of the cushion member 31 is not adhesive, the heat conduction sheet 30 may be fixed to the cushion member 31 using the adhesive agent.

The heat dissipating structure 25 is formed in the following process. The formed heat dissipating members 28 are orthogonally arranged to the winding direction of the heat conduction sheet 30 (longitudinal direction of the heat dissipating member 28), and connected by the connection member 35 while being sewn on the fixation member 50 with the thread 52. More specifically, the heat dissipating structure 25 is formed by connecting the arranged heat dissipating members 28 with the thread as the connection member 35 through manual sewing. Preferably, the heat dissipating members 28 are arranged at each distance L1 therebetween set to 0.114 D or longer (see FIG. 1C). Preferably, the sewing is performed to form the twisted portion 37 between the heat dissipating members 28. In the heat dissipating structure 25, both longitudinal ends of each of the heat dissipating members 28 are preferably sewn on the frame 54 with the thread 52 using the sewing machine. The heat dissipating structure 25 allows positioning of the heat dissipating members 28 while being fixed to the fixation member 50.

In the heat dissipating structure 25 having the blind-like connected heat dissipating members 28, under the pressure force from the cell 20, the heat dissipating member 28 is crushed to be vertically and horizontally expanded following the surface of the cell 20. When the cells 20 are removed, elastic force of the heat dissipating member 28 restores its original shape. The heat dissipating structure 25 allows the blind-like connected heat dissipating members 28 to be positioned by the fixation member 50. This reliably brings the heat dissipating members 28 into contact with the cells 20. The heat dissipating structure 25 may prevent the heat dissipating members 28 from being unevenly distributed owing to vibration of the automobile, and enhance uniformity in heat dissipating among the cells 20. In the heat dissipating structure 25, as each of the heat dissipating members 28 has the heat conduction sheet 30 spirally wound around the outer surface of the cushion member 31, the cushion member 31 will not excessively restrain deformation of the cushion member 31. The frame 54 of the fixation member 50 allows the operator to mount the heat dissipating structure 25 in the battery 1 while manually holding the frame 54, thus improving operability.

Second Embodiment

A heat dissipating structure according to a second embodiment, and a battery provided with the heat dissipating structure are described. Portions common with those of the first embodiment are denoted by the same reference numerals, and redundant description is omitted.

Figure 5A:
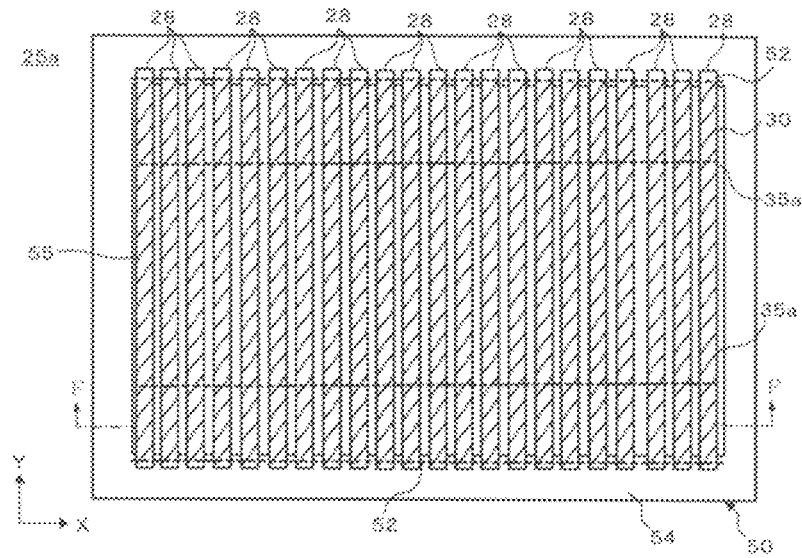
FIG. 5A is a plan view of a heat dissipating structure according to a second embodiment.
Figure 5B:
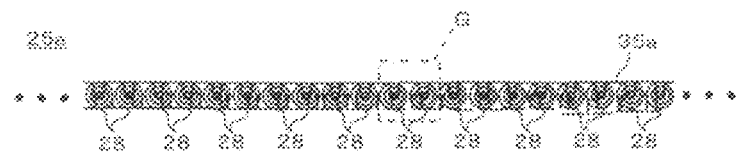
FIG. 5B is a sectional view taken along line F-F of FIG. 5A.
Figure 5C:
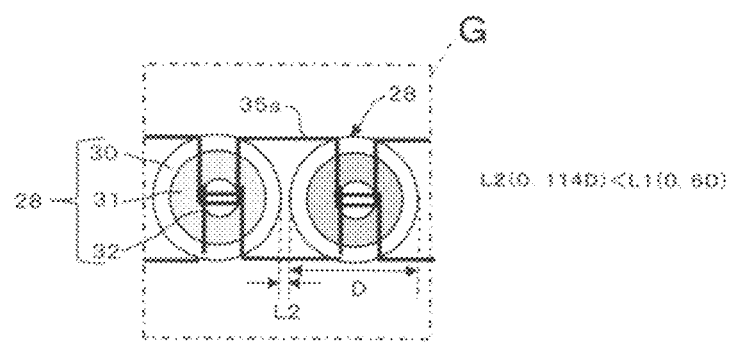
FIG. 5C is an enlarged view of a region G of FIG. 5B.

FIG. 5A is a plan view of the heat dissipating structure according to the second embodiment. FIG. 5B is a sectional view taken along line F-F of FIG. 5A. FIG. 5C is an enlarged view of a region G of FIG. 5B.

Unlike the heat dissipating structure 25 of the first embodiment, a heat dissipating structure 25a of the second embodiment has the plurality of heat dissipating members 28 connected by connection members 35a. Other configuration except the connection member 35a is common with that of the first embodiment, and an explanation thereof, thus is omitted.

Likewise the connection member of the first embodiment, the connection member 35a is formed of the thread or the rubber as the material partially deformable at a region at least between the heat dissipating members 28. In this embodiment, the connection member 35a is preferably formed of the thread, and more preferably formed of the thread sufficient to resist the temperature rise owing to heat dissipation from the cell 20. The connection member 35a is used for sewing the heat dissipating members 28 using the sewing machine or the like. An arbitrary stitching for forming the connection member 35a may be selectively used from hand stitching, final stitching, zigzag stitching, single chain stitching, double chain stitching, hem stitching, flat stitching, safety stitching, overlock stitching, and the like. The stitching may also be selected from those prescribed by JIS L 0120 as codes of "101", "209", "301", "304", "401", "406", "407", "410", "501", "502", "503", "504", "505", "509", "512", "514", "602", and "605". Unlike the connection member 35 of the first embodiment, the connection member 35a does not have the twisted portions 37 each interposed between the heat dissipating members 28.

The heat dissipating structure 25a is formed in the following process. The formed heat dissipating members 28 likewise the first embodiment are orthogonally arranged to the winding direction of the heat conduction sheet 30, and connected by the connection members 35a while being sewn on the fixation member 50 with the thread 52. More specifically, the heat dissipating structure 25a is formed by connecting the arranged heat dissipating members 28 by the connection member 35a through sewing with the thread using the sewing machine or the like. The heat dissipating members 28 are arranged at each distance L2 smaller than the distance L1 (see FIG. 5C). Specifically, the distance L2 is set to the value 11.4% (=0.114 D) of the circular conversion diameter D of the heat dissipating member 28. Under the condition, the heat dissipating member 28 may be vertically crushed to have the thickness up to approximately 80% of the circular conversion diameter D. By setting the distance L2 to 0.114 D or longer, the heat dissipating member 28 never becomes the obstacle to deformation of the adjacent heat dissipating member 28 when they are crushed under pressure force to have each thickness equal to or smaller than 80% of the circular conversion diameter. The shorter the distance L2 between the heat dissipating members 28 becomes, the more stable the connection between the heat dissipating members 28 becomes upon sewing using the sewing machine. The heat dissipating members 28 can be crushed to be vertically and horizontally expanded in a non-restricted manner while following and coming in tight contact with the surface of the cell 20 until they come in contact with each other. When the cells 20 are removed, the elastic force of the heat dissipating member 28 allows the heat dissipating structure 25a to have its original shape restored. The heat dissipating structure 25a having the heat dissipating members 28 blind-like connected restrains uneven distribution of the heat dissipating members 28 owing to vibration of the automobile, thus improving workability. Especially in the heat dissipating structure 25a, the heat dissipating members 28 are connected by the connection members 35a using the sewing machine. This improves workability when the number of the heat dissipating members 28 constituting the heat dissipating structure 25a becomes large.

Third Embodiment

A heat dissipating structure according to a third embodiment and a battery provided with the heat dissipating structure are described. Portions common with those of the embodiments are denoted by the same reference numerals, and redundant description is omitted.

Figure 6:
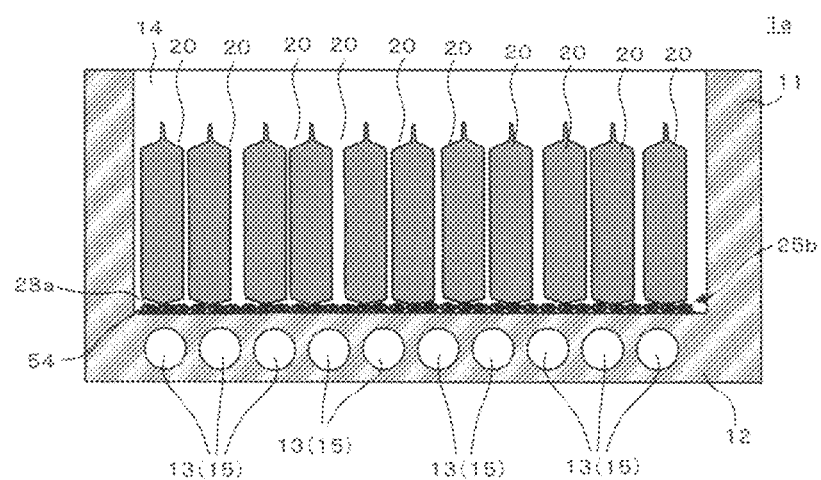
FIG. 6 is a longitudinal sectional view of a heat dissipating structure according to a third embodiment, and a battery provided with the heat dissipating structure.
Figure 7A:
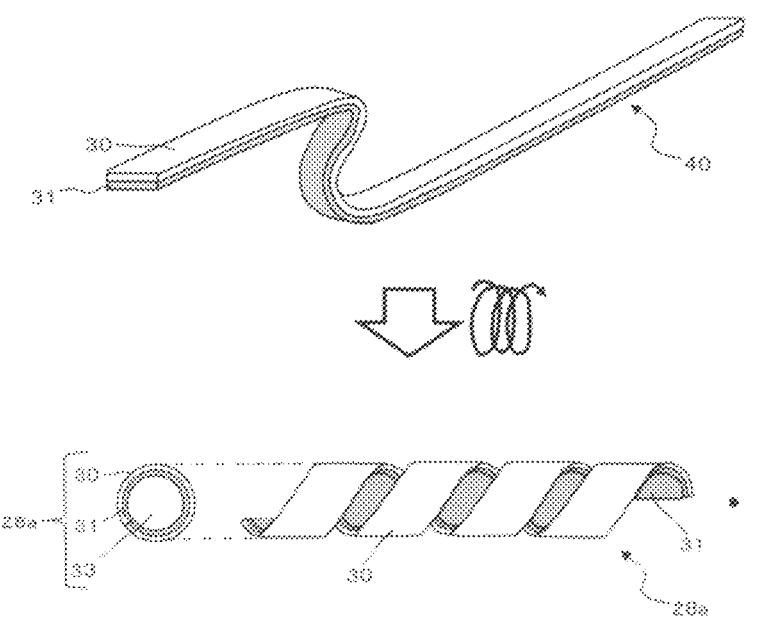
FIG. 7A is an explanatory view showing a part of a process of forming the heat dissipating structure according to the third embodiment.
Figure 7B:
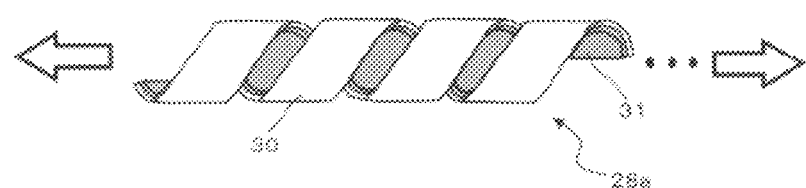
FIG. 7B is a plan view of the heat dissipating structure formed by the process shown in FIG. 7A.

FIG. 6 is a longitudinal sectional view of the heat dissipating structure according to the third embodiment, and a battery provided with the heat dissipating structure. FIG. 7A shows a part of a process of forming the heat dissipating structure of the third embodiment. FIG. 7B is a plan view of the heat dissipating structure formed by the process as shown in FIG. 7A.

A battery 1a according to the third embodiment includes a heat dissipating structure 25b different from the heat dissipating structure 25 disposed in the battery 1 according to the first embodiment, and has the other structure common with the battery 1. The heat dissipating structure 25b used in this embodiment is formed by connecting a plurality of heat dissipating members 28a different from the heat dissipating members 28 of the first embodiment by the connection member 35. The cushion member 31 of the heat dissipating member 28a is not cylindrically shaped, but is belt-like shaped to be applied to the back side of the heat conduction sheet 30. The cushion member 31 is spirally wound together with the heat conduction sheet 30.

A method of forming the heat dissipating structure 25b including the spiral cushion member 31 (referred to as "spiral cushion member 31" or simply "cushion member 31") is described below.

A laminated body 40 is formed to have two layers of the heat conduction sheet 30 and the cushion member 31 each having substantially the same width. The heat conduction oil is applied to the surface of the heat conduction sheet 30. The laminated body 40 having the surface applied with the heat conduction oil is spirally (coil-like) wound in one direction. The long heat dissipating member 28a may be formed by spirally winding the laminated body 40. The heat conduction oil may be applied to the heat conduction sheet 30 before forming the laminated body 40, or in the final step. Preferably, the heat conduction sheet 30 is laminated onto the cushion member 31 in the uncured state before it is completely cured. The cushion member 31 is then heated to be completely cured so that the laminated body 40 is formed.

The heat dissipating members 28a are orthogonally arranged to the winding direction (longitudinal direction of the heat dissipating member 28a) of the heat conduction sheet 30, and connected by the connection member 35. They are further sewn on the fixation member 50 with the thread 52 to form the heat dissipating structure 25b.

The heat dissipating member 28a including a through passage 33 penetrating in the longitudinal direction is different from the heat dissipating member 28 of the first embodiment in that the through passage 33 further extends toward the outer surface of the heat dissipating member 28a.

The spirally shaped heat dissipating member 28*a* is more flexible in the longitudinal direction (in white arrow directions of FIG. 7B) than the heat dissipating member 28.

The heat dissipating structure 25*b* can be disposed not only between the cells 20 and the bottom 12 of the housing 11, but also in gaps between the cells 20 and an inner side surface of the housing 11, and/or in gaps between the cells 20.

Functions and Advantageous Effects of Embodiments

The heat dissipating structures 25, 25*a*, 25*b* (to be collectively and representatively referred to as the "heat dissipating structure 25") are formed by connecting the plurality of heat dissipating members 28 or 28*a*, respectively for enhancing heat dissipation from the cells 20, as described above. The heat dissipating members 28, 28*a* include the heat conduction sheets 30, the cushion members 31, and the through passages 32, 33, respectively. The heat conduction sheet 30 is spirally winding to conduct heat from the cell 20. The cushion member 31 is provided on the annular back surface of the heat conduction sheet 30, and deformable following the surface shape of the cell 20 more easily than the heat conduction sheet 30. The through passages 32, 33 penetrate in the winding direction of the heat conduction sheet 30. The heat dissipating structure 25 includes the fixation member 50 on which the heat dissipating members 28 or 28*a* are orthogonally arranged to the longitudinal direction for fixing at least each one longitudinal end of the heat dissipating members 28 or 28*a*.

The heat dissipating structure 25 is adaptable to various forms of the cell 20, excellent in elastic deformability and heat dissipating efficiency, and capable of enhancing uniformity in heat dissipation among the cells 20. The through passage 32 or 33 contributes to weight reduction in the heat dissipating structure 25.

The fixation member 50 that constitutes the heat dissipating structure 25 is formed to surround the heat dissipating members 28 or 28*a* orthogonally arranged to the longitudinal direction thereof. This allows the operator to mount the heat dissipating structure 25 in the battery 1 or 1*a* while holding the fixation member 50, thus improving operability.

The fixation member 50 constituting the heat dissipating structure 25 is formed to have a thickness T smaller than the thickness of the heat dissipating member 28 or 28*a* deformed under the pressure force from the cell 20. The heat dissipating structure 25 prevents the contact between the cell 20 and the fixation member 50 from being the obstacle to further crushing of the heat dissipating members 28 vertically compressed by the cell 20.

The cushion member 31 constituting the heat dissipating structure 25 is cylindrically shaped to have the through passage 32 penetrating in the longitudinal direction. The heat conduction sheet 30 is spirally wound around the outer surface of the cylindrical cushion member. The batteries 1, 1*a* include the heat dissipating structures 25 in contact with the cells 20 inside the housings 11, respectively. The heat conduction sheet 30 partially covers the outer surface of the cylindrical cushion member, and is spirally winding around the cylindrical cushion member in the longitudinal direction. In the batteries 1, 1*a*, the heat dissipating structures 25 are respectively disposed at least between the cells 20 and the cooling agent 15. Therefore, the heat dissipating structure 25 is unlikely to be constrained by the heat conduction sheet 30, and is deformable following recess and protruding portions on the surface of the cell 20.

In the heat dissipating structure 25*b*, the cushion member 31 is spirally wound along the annular back surface of the heat conduction sheet 30. In the battery 1*a*, the heat dissipating structure 25*b* is disposed at least between the cells 20 and the cooling agent 15. The heat dissipating structure 25*b* may be disposed between the inner side surface of the housing 11 and the cells 20, and/or between the cells 20. The heat dissipating structure 25*b* is spirally shaped entirely, and therefore is more adaptable to various sizes of the cell 20. Specifically, the highly rigid heat conduction sheet 30 is deformable under low load to follow and comes in close contact with the surface of the cell 20. Furthermore, even if the deformation amount partially differs, the adhesiveness and follow-up property may be improved. As the cushion member 31 is spirally cut, the single spiral portion may be deformed separately. Therefore, the heat dissipating structure 25*b* may enhance flexibility in local deformation. In addition, the heat dissipating structure 25*b* includes not only the through passage 33, but also a spiral through groove extending from the through passage 33 to the side surface, resulting in weight reduction.

The connection members 35, 35*a* connect the heat dissipating members 28, 28*a* orthogonally arranged to the longitudinal direction thereof, respectively. The connection members 35, 35*a* are formed of threads. The heat dissipating structure 25 is formed by connecting the heat dissipating members 28 or 28*a* in the blind-like manner. This makes it possible to restrain uneven distribution of the heat dissipating members 28 or 28*a* owing to vibration of the automobile or the like, thus improving workability.

The connection members 35, 35*a* include the twisted portions 37 interposed between the heat dissipating members 28, 28*a*, respectively to further enhance the follow-up property and adhesiveness with the surface of the cell 20.

The heat conduction oil is applied to the surface of the heat conduction sheet 30 for enhancing heat conduction to the surface from the cell 20 in contact therewith. The heat conduction sheet 30 includes gaps (holes or recess portions) on the microscopic level. Normally, air existing in the gap may exert adverse influence on heat conductivity. The heat conduction oil is filled in the gap to remove air, and further enhance heat conductivity of the heat conduction sheet 30.

The heat conduction oil contains the silicone oil and the heat conduction filler that exhibits higher heat conductivity than the silicon oil, and is composed of at least one of metal, ceramics and carbon. The silicone oil is excellent in heat resistance, cold resistance, viscosity stability, and heat conductivity. Especially, the heat conduction oil is suitably applied to the surface of the heat conduction sheet 30 to intervene between the cell 20 and the heat conduction sheet 30. The heat conduction filler contained in the heat conduction oil serves to enhance heat conductivity of the heat conduction sheet 30.

Each of the batteries 1, 1*a* includes one or more cells 20 as heat sources in the housing 11 that allows flow of the cooling agent 15, and further includes the heat dissipating structure 25. In the heat dissipating structure 25, each of the connectedly arranged heat dissipating members 28, 28*a* includes the heat conduction sheet 30 spirally winding for conducting heat from the cell 20, the cushion member 31 that is provided on the annular back surface of the heat conduction sheet 30, and deformable following the surface shape of the cell 20 more easily than the heat conduction sheet 30, and the through passage 32 or 33 penetrating in the winding direction of the sheet conduction sheet 30. The heat dissipating structure 25 includes the fixation member 50 capable of fixing at least one longitudinal end of each of the heat dissipating members 28, 28a orthogonally arranged to the longitudinal direction thereof. The above-structured batteries 1, 1a are adaptable to various forms of the cells 20, excellent in elastic deformability and heat dissipating efficiency, and capable of enhancing uniformity in heat dissipation among the cells 20. The through passage 32 or 33 contributes to weight reduction in the heat dissipating structure 25.

Other Embodiments

The preferred embodiments of the present invention have been described. However, the present invention is not limited to those embodiments, and may be variously modified for implementation.

Figure 8A:
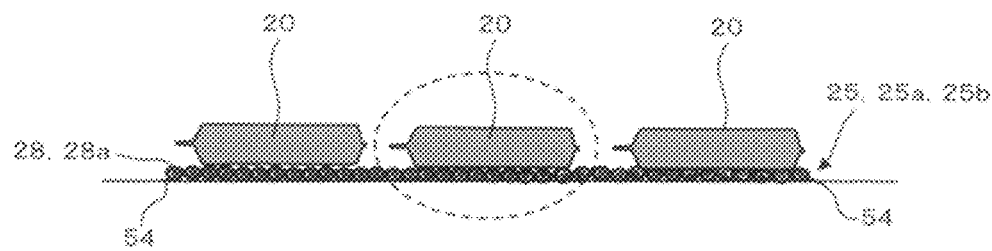
FIG. 8A is a sectional view showing battery cells placed transversely on the heat dissipating structure while having each side surface in contact therewith.
Figure 8B:
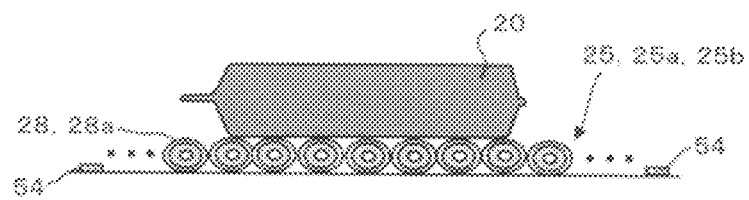
FIG. 8B is a partially enlarged view of FIG. 8A.
Figure 8C:
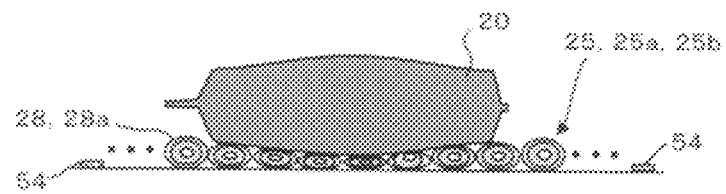
FIG. 8C is a sectional view partially showing expansion of the battery cell in charging-discharging.

FIG. 8A is a sectional view of the heat dissipating structure on which cells are placed transversely having each one side surface in contact with the heat dissipating structure. FIG. 8B is a partially enlarged view of FIG. 8A. FIG. 8C is a sectional view of FIG. 8A partially showing the cell expanded in charging-discharging.

In the aforementioned embodiments, the cells 20 are vertically placed, having each lower end in contact with the heat dissipating structure 25. The cells may be arbitrarily placed without being limited to the arrangement as described above. As FIG. 8A shows, the cells 20 may be placed to allow the respective one side surfaces to come in contact with the respective heat dissipating members 28 or 28a of the heat dissipating structure 25. The cell 20 has its temperature increased in charging and discharging. The use of the highly flexible material for forming the container of the cell 20 may expand especially the side surface of the cell 20. However, as shown in FIG. 8C, the heat dissipating members 28 or 28a constituting the heat dissipating structure 25 are deformable following the outer surface of the cell 20. This maintains high heat dissipating property even in charging and discharging.

For example, the heat source includes not only the cells 20 but also all heat generating elements such as a circuit board and an electronic device body. For example, the heat source may be an electronic component such as a capacitor and an IC chip. Similarly, the cooling agent 15 may be not only cooling water but also organic solvent, liquid nitrogen, and cooling gas. The heat dissipating structure 25 may be disposed in structures other than the battery 1 and the like, for example, electronic devices, home electric appliances, and power generators.

The heat dissipating members 28 or 28a constituting the heat dissipating structure 25 may have only longitudinal one ends fixed to the fixation member 50. The heat dissipating structure 25 may have four sides constituting the inner periphery of the frame 54 of the fixation member 50 connected to the heat dissipating members 28 or 28a with the thread 52. In the heat dissipating structure 25, both longitudinal ends of each of the heat dissipating members 28 or 28a are fixed to the fixation member 50 as described in the embodiments. Additionally, it is also possible to further fix the heat dissipating members 28 or 28a positioned at both sides in the direction (width direction) orthogonal to the longitudinal direction of those arranged in the heat dissipating structure 25 to two parallel opposite sides of the four sides constituting the inner periphery of the frame 54.

The fixation member 50 may be formed into an arbitrary shape with no limitation so long as at least each one longitudinal end of the heat dissipating members 28 or 28a has a fixable shape. For example, the fixation member 50 may be formed as one or more long members rather than the shape of the frame 54. Instead of the rectangular frame-like member, the frame 54 may be formed to have an outer shape of ellipse, circle, triangle, or polygon equal to or more than pentagon in a planar view while having the opening 55 therein. In the respective embodiments, the frame 54 is fixed to the heat dissipating members 28 so that the surface of the frame 54 closer to the bottom 12 is positioned at the same level as the surface of the heat dissipating member 28 closer to the bottom 12. The heat dissipating member 28 may be fixed to the frame 54 so that the surface of the frame 54 closer to the cell 20 is positioned at the same level as the surface of the heat dissipating member 28 closer to the cell 20. The frame 54 may be fixed to an intermediate position of the heat dissipating member 28 in the height direction (direction from the cell 20 toward the bottom 12).

The heat dissipating structure 25 does not have to include the connection members 35 or 35a. Preferably, both longitudinal ends of each of the heat dissipating members 28 or 28a constituting the heat dissipating structure 25 are fixed to the fixation member 50 by adhesion, fitting, or the like. In this case, the fixation member 50 serves to position and connect the heat dissipating members 28 or 28a of the heat dissipating structure 25.

The width of the spirally shaped cushion member 31 of the heat dissipating member 28a does not have to be the same as the width of the heat conduction sheet 30, but may be either larger or smaller. In the embodiments, the through passage 32 is formed in the cushion member 31. However, the through passage 32 does not have to be formed in the cushion member 31. In this case, the heat dissipating member 28 is structured to have the through passage of the spiral heat conduction sheet 30 filled with the cushion member 31. The through passage 32 does not have to be formed in the cushion member 31 so long as it is formed in any one of the heat conduction sheet 30 and the cushion member 31, at least in the winding structure of the heat conduction sheet 30.

A plurality of components of each of the embodiments can be freely combined except those regarded as impossible. For example, the heat dissipating structure 25b according to the third embodiment may be disposed in place of the heat dissipating structure 25 according to the first embodiment.

The heat dissipating structure according to the present invention can be utilized for, for example, various electronic devices such as automobiles, industrial robots, power generators, PCs, household electric appliances in addition to batteries for automobiles. The battery according to the present invention can be utilized as those to be used in electronic devices such as household batteries capable of charging-discharging, and PCs in addition to those for automobiles.

REFERENCE SIGNS LIST 1, 1a battery
11 housing
15 cooling agent
20 battery cell(an example of heat sources)
25, 25a, 25b heat dissipating structure
28, 28a heat dissipating member
30 heat conduction sheet
31 cushion member
32, 33 through passage
35, 35a connection member
37 twisted portion
50 fixation member
52 thread T thickness of fixation member

What is claimed is:

1. A heat dissipating structure comprising a plurality of heat dissipating members connected to each other and configured to enhance heat dissipation from a heat source and a fixation member, wherein each of the plurality of heat dissipating members comprises:
- a heat conduction sheet in a spirally winding shape, wherein the heat conduction sheet has an annular back surface in an inner side of the spirally winding shape, and the heat conduction sheet is configured to conduct heat from the heat source,
- a cushion member on the annular back surface of the heat conduction sheet, the cushion member being deformable following a surface shape of the heat source more easily than the heat conduction sheet, and
- a through passage penetrating the cushion member in a winding direction of the heat conduction sheet,
- wherein the fixation member is configured to fix the heat dissipating members orthogonally arranged to a longitudinal direction of the heat dissipating member and is configured to fix at least one end of each of the heat dissipating members in the longitudinal direction.

2. The heat dissipating structure of claim 1, wherein the fixation member is configured to fix both ends of each of the heat dissipating members in the longitudinal direction.

3. The heat dissipating structure of claim 1, wherein the fixation member is formed to surround the heat dissipating members orthogonally arranged to the longitudinal direction of the heat dissipating member.

4. The heat dissipating structure of claim 1, wherein the fixation member has a thickness smaller than a thickness of the heat dissipating member deformed under pressure force applied from the heat source.

5. The heat dissipating structure of claim 1, wherein:
- the cushion member is a cylindrically shaped cushion member including the through passage; and
- the heat conduction sheet is spirally wound around an outer surface of the cylindrically shaped cushion member.

6. The heat dissipating structure of claim 1, wherein the cushion member is a spirally shaped cushion member spirally winding along the annular back surface of the heat conduction sheet.

7. The heat dissipating structure of claim 1, further comprising a connection member configured to connect the heat dissipating members orthogonally arranged to the longitudinal direction, the connection member being formed of a thread.

8. The heat dissipating structure of claim 7, wherein the connection member includes a twisted portion interposed between the heat dissipating members.

9. The heat dissipating structure of claim 1, wherein a heat conduction oil is applied to a surface of the heat conduction sheet in a manner to enhance heat conductivity to the surface from the heat source in contact with the surface.

10. The heat dissipating structure of claim 9, wherein the heat conduction oil includes a silicone oil, and a heat conduction filler that exhibits higher heat conductivity than the silicone oil.

11. A battery including one or more battery cells each as a heat source in a housing configured to allow flow of a cooling agent, wherein the heat dissipating structure of claim 1, is disposed between the battery cell and the housing.

12. The heat dissipating structure of claim 1, wherein the cushion member has a spiral shape corresponding to the spirally winding shape of the heat conduction sheet and laminated on the annular back surface of the heat conduction sheet.

13. The heat dissipating structure of claim 6, wherein the cushion member is a coil spring.

14. The heat dissipating structure of claim 1, wherein the heat dissipating members are fixed onto the fixation member with a thread.

15. The heat dissipating structure of claim 7, wherein the thread is resistant to temperature rise due to heat dissipation from the heat source.

16. The heat dissipating structure of claim 1, wherein a thickness of a deformed heat dissipating member in a height direction under a vertical pressure force from a heat source is at least 80% of a cross section diameter of the heat dissipating member.

17. The heat dissipating structure of claim 10, wherein the heat conduction filler includes at least one of metal, ceramics, or carbon.

* * * * *